United States Patent [19]
Tiemann

[11] Patent Number: 5,241,310
[45] Date of Patent: Aug. 31, 1993

[54] WIDE DYNAMIC RANGE DELTA SIGMA ANALOG-TO-DIGITAL CONVERTER WITH PRECISE GAIN TRACKING

[75] Inventor: Jerome J. Tiemann, Schenectady, N.Y.

[73] Assignee: General Electric Company, Schenectady, N.Y.

[21] Appl. No.: 844,030

[22] Filed: Mar. 2, 1992

[51] Int. Cl.$^5$ .............................................. H03M 3/02
[52] U.S. Cl. .................................... 341/143; 341/139
[58] Field of Search .................. 341/143, 155, 139; 375/26, 27, 28, 29, 33, 34

[56] References Cited

U.S. PATENT DOCUMENTS

| | | | |
|---|---|---|---|
| Re. 31,976 | 8/1985 | DeFreitas | 375/29 X |
| 4,851,841 | 7/1989 | Sooch | 341/143 |
| 5,030,954 | 7/1991 | Ribner | 341/172 |
| 5,065,157 | 11/1991 | Ribner et al. | 341/143 |
| 5,084,702 | 1/1992 | Ribner | 341/143 |
| 5,103,229 | 4/1992 | Ribner | 341/143 |

OTHER PUBLICATIONS

Hurst et al., "Delta-Signa A/Ds With Reduced Sensitivity To Op Amp Noise," IEEE Proc. ISCAS '89, pp. 254-257, May 1989.
Hauser et al., "MOS ADC-Filter Combination That Does Not Require Precision Analog Components", ISSCC Dig. Tech. Pap., pp. 80-81, 313, Feb. 1985.
J. C. Candy, "A Use of Limit Cycle Oscillators to Obtain Robust Analog to Digital Converters", IEEE Transactions on Communications, vol. COM-22, No. 3, Mar. 1974, pp. 298-305.
J. C. Candy et al., "Using Triangularly Weighted Interpolation to get 13-Bit PCM from a Sigma-Delta Modulator", IEEE Transactions on Communications, vol. COM-24, No. 11, Nov. 1976, pp. 1268-1275.
J. C. Candy, "A Use of Double Integration in Sigma Delta Modulation", IEEE Transactions on Communications, vol. COM-33, No. 3, Mar. 1985, pp. 249-258.

*Primary Examiner*—Sharon D. Logan
*Attorney, Agent, or Firm*—Marvin Snyder

[57] ABSTRACT

A delta sigma analog-to-digital architecture assures that all channels in a multi-element receiver follow the same compression and/or time-gain variation curve. This is accomplished by varying the reference voltage as a function of time so that the full scale range and associated quantization noise are large at the beginning of the receiving interval and become smaller as more distant echoes arrive All channels follow the identical gain curve since all channels have the same reference voltage at the same time. The distribution of time-varying reference voltages may be done by using analog buses or by employing a timevarying digital code that specifies the reference voltages derived from a digital-to-analog (D/A) converter. In the latter case, corrections can be applied to the code at each channel.

11 Claims, 3 Drawing Sheets

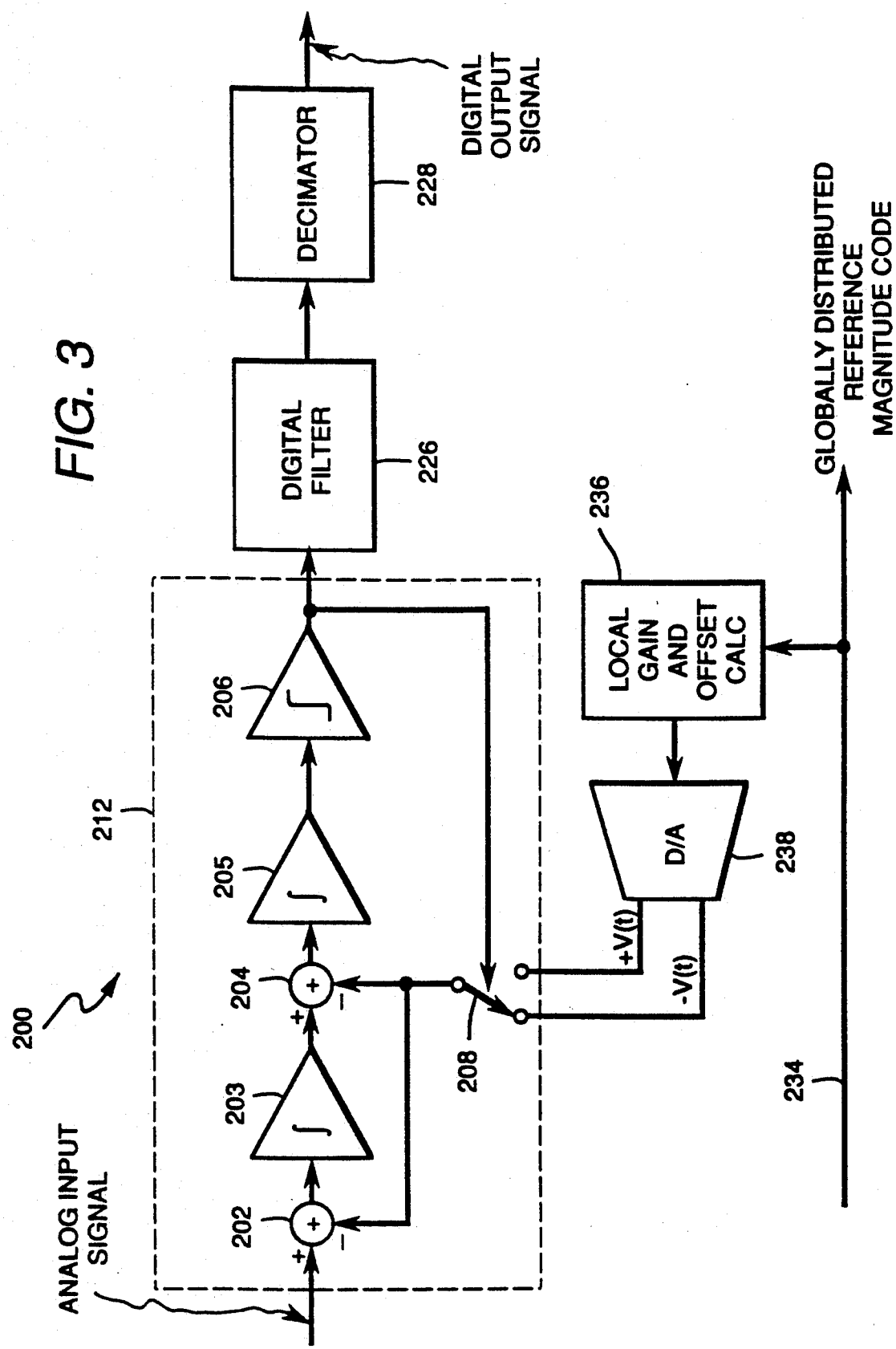

WIDE DYNAMIC RANGE DELTA SIGMA ANALOG-TO-DIGITAL CONVERTER WITH PRECISE GAIN TRACKING

CROSS REFERENCE TO RELATED APPLICATION

This application is related in subject matter to copending U.S. patent application Ser. No. 07/844,029 filed Mar. 2, 1992 by Jerone J. Tiemann and Steven L. Garverick for "Delta Sigma Analog-to-Digital Converter with Increased Dynamic Range" and assigned to the present assignee, now U.S. Pat. No. 5,187,482, issued Feb. 16, 1993. The subject matter thereof is hereby i by reference.

BACKGROUND OF THE INVENTION

1. Field of the Invention

The present invention generally relates to oversampled analog-to-digital (A/D) converters and, more particularly, to wide dynamic range delta sigma A/D converters with precise gain tracking. The gain tracking may be accomplished with either analog or digital techniques. A/D converters incorporating the features of the invention have particular application in multiple channel systems wherein an A/D converter is employed in each channel and each A/D converter must precisely follow the same compression and/or time-gain variation curve.

2. General Description of the Prior Art

With recent advances in the use of digital signalprocessing techniques for analog signals, many refinements in the basic and well-known process of analog-to-digital (A/D) conversion have been required. A/D converters have become very sophisticated, providing conversions at high speeds and with increasing accuracy. High resolution A/D signal conversion can be achieved with lower resolution components through the use of oversampled interpolative (or delta sigma) modulation followed by digital low pass filtering and decimation. Oversampling refers to operation of the modulator at a rate many times greater than the Nyquist rate, whereas decimation refers to reduction of the clock rate by periodic deletion of samples.

Delta sigma modulators (sometimes referred to as sigma delta modulators) have been used in A/D converters for some time. Detailed general information can be obtained from the following technical articles which are hereby incorporated by reference:

1) "A Use of Limit Cycle Oscillators to Obtain Robust Analog to Digital Converters", J. C. Candy, *IEEE Transactions on Communications*, vol. COM-22, no. 3, March 1974, pp. 298-305.
2) "Using Triangularly Weighted Interpolation to Get 13-Bit PCM from a Sigma-Delta Modulator", J. C. Candy et al., *IEEE Transactions on Communications*, vol. COM-24, no. 11, November 1976, pp. 1268-1275.
3) "A Use of Double Integration in Sigma Delta Modulation", J. C. Candy, *IEEE Transactions on Communications*, vol. COM-33, no. 3, March 1985, pp. 249-258.

Broadly described, a delta sigma A/D converter uses an internal A/D converter of modest resolution and a complementary digital-to-analog (D/A) converter in a feedback loop. The feedback loop increases accuracy of the A/D converter in a manner consistent with the high speed operation afforded by the internal A/D converter. In theory, any error in linearity or resolution caused by the D/A converter is effectively added to the input signal and appears at the output without attenuation.

Substantial effort has been expended in the field of oversampled A/D converter design to develop a delta sigma A/D converter with an increased dynamic range. Delta sigma A/D converters employ an analog integrator at the input to assure that the average of the digital output bits equals the average of the signal. This makes them inherently linear (assuming that the integrator is linear); however, a linear A/D converter wastes resolution in cases where the noise level is not uniform with signal amplitude. Attempts to match delta sigma A/D converters to applications that have non-uniform noise levels have used companding, but use of companding may make it necessary to restore linearity. This requires an exactly invertible companding characteristic.

Active imaging systems such as radar, sonar and ultrasound systems require very large dynamic range since reflections from nearby objects are generally of much larger amplitude than reflections from objects farther away. At present, this problem is solved by introducing some form of compression before the analog-to-digital (A/D) converter or by using an A/D converter with a relatively large number of bits of resolution. Another solution that is often used, particularly in ultrasound systems, is to introduce a time dependent amplification so as to equalize the amplitudes of the reflections. All of these approaches have drawbacks. In the case of an array of receivers, it is difficult to make all channels follow an identical compression curve. High resolution A/D converters are expensive and require much power, and again in the case of an array of receivers, it is difficult to make all the channel gains track each other as the gains are changing.

Nonlinear gain compression curves are usually derived from nonlinear analog components (such as diodes) which are subject to component variations. Similarly, electronically variable gain elements depend on analog components which are subject to variations. These variations make it difficult to form high quality beams from phased arrays.

SUMMARY OF THE INVENTION

It is therefore an object of the present invention to provide a data acquisition system with a total dynamic range much larger than the instantaneous dynamic range available at any instant without requiring any adjustment (electronically controlled or otherwise) of the gains in the analog stages preceding the A/D converter.

Another object of the invention is to provide a plurality of channels in a data acquisition system with total dynamic range much larger than the instantaneous dynamic range, such that all channels follow identical curves of gain versus time.

A further object of the invention is to provide identical gain versus time curves for the channels of a multiple channel data acquisition system without requiring any adjustment of critical analog components.

According to the invention, a technique is provided for assuring that all channels in a multielement receiver follow the same compression and/or time-gain variation curve. This is accomplished by using, in each channel, a delta sigma A/D converter of conventional architecture except that the reference voltage, which is normally held constant, is varied as a function of time so that the full scale range and associated quantization noise are large at the beginning of the receiving interval and become smaller as more distant echoes arrive. All that is needed to assure that all channels follow the identical gain curve is to assure that all channels have the same reference voltage at the same time. The deficiency of present systems, namely the need to align all of the gain curves by adjusting analog components, is thus avoided by distributing a time-varying reference voltage or a time-varying digital code that specifies a reference voltage derived from a digital-to-analog (D/A) converter.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

FIG. 3 is a block diagram of an alternative embodiment of the invention wherein globally distributed reference magnitude codes are used.

DETAILED DESCRIPTION OF PREFERRED EMBODIMENTS OF THE INVENTION

Figure 1:
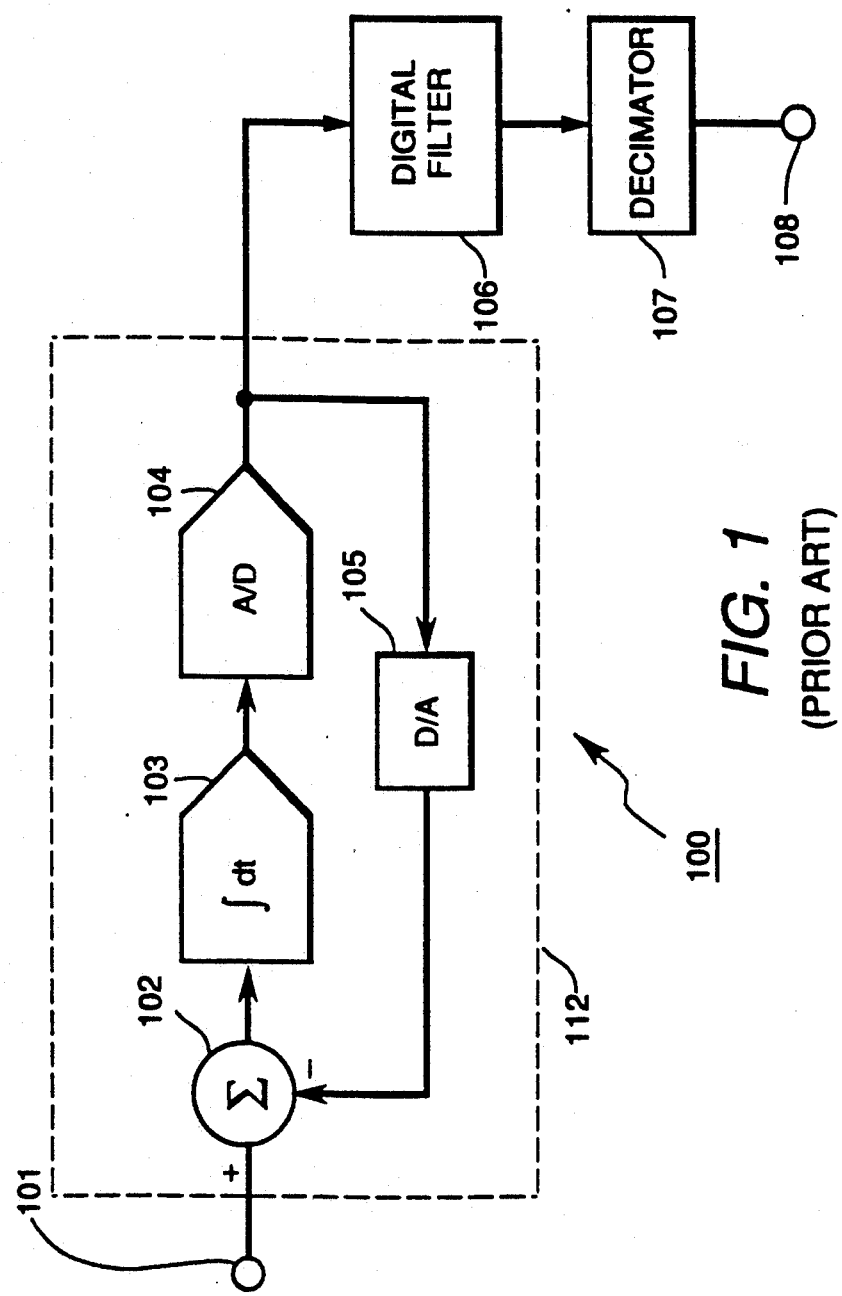
FIG. 1 is a block diagram of a conventional, first order delta sigma A/D converter.

FIG. 1 illustrates a first order delta sigma A/D converter arrangement 100 known in the art, as generally discussed above. For simplicity of illustration and explanation, a first order delta sigma A/D converter arrangement is shown, but it will become clear from the following discussion that a delta sigma A/D converter arrangement of any order may be used in practicing the invention. In fact, any A/D architecture can be used provided a single reference voltage defines all the quantized levels.

A/D converter arrangement 100 employs an oversampled modulator 112; that is, a modulator which samples at a rate well above the Nyquist rate. An A/D converter 104 and D/A converter 105 employed in modulator 112 may each be of single bit resolution (e.g., a simple comparator and a pair of switches coupling the comparator output to each of two reference voltages, respectively) or may be multi-bit circuits. The following discussion of this circuit will assume the latter for purposes of conveying an understanding of the invention.

An analog input signal, oversampled at a high rate (e.g., greater than 16:1), is applied to input terminal 101 and is differentially summed with a feedback signal at summer 102. This summed signal is applied to an integrator 103. Because modulator 112 employs but a single integrator 103, the modulator operates as a first order modulator. The output signal of integrator 103 is converted to a multi-bit digital signal by A/D converter 104. This multi-bit digital signal is applied to a digital filter 106, and the output signal produced by filter 106 is decimated by a decimator 107 in order to match the desired sample rate at the decimator output 108. The A/D converter output signal is also applied to the input of D/A converter 105 which performs a reconversion to an analog signal that is ideally complementary to the operation of A/D converter 104. The reconverted analog signal is differentially summed with the input signal to derive the error signal which is integrated with the previous data sample and error values and converted to an updated digital value. This operation is repeatedly performed as long as the circuit is operating.

In the architecture of FIG. 1, integrator 103 receives the output signal of differential summer 102 as an error signal. This error signal reflects not only changes in the input signal and aliasing errors due to the limit of resolution of A/D converter 104 (which will be reflected in the D/A converted signal), but also reflects errors due to deviations from complementarity of the output signals produced by each of A/D converter 104 and D/A converter 105. Integrator 103 accumulates all such errors without regard to their source. Therefore, to avoid discrepancies in the accumulated error value, the resolution and accuracy of the D/A conversion must be at least as great as that of the final decimated A/D conversion. In terms of hardware, D/A converter 105 must be capable of processing at least as many bits as the overall A/D converter 100 after filtering and decimation, at an accuracy not less than the incremental value corresponding to the least significant bit (LSB) of the overall A/D converter 100 after filtering and decimation. This not only presents a severe design constraint and engenders high circuit complexity and expense, but also limits the sampling rate. Furthermore, it is difficult to manufacture circuits which will reliably meet this criterion due to manufacturing variations from part to part and ambient operating conditions (e.g., thermal drift).

Even if the aforementioned design constraint is scrupulously observed, accuracy of the A/D conversion is less than optimal since any error in the D/A conversion is reflected in the output signal of the A/D converter. The output signal error is not amenable to correction since the D/A converter adds directly to the input signal.

The subject invention is a special case of a more general invention disclosed in the above referenced co-pending application Ser. No. 07/844,029. In that application, the more general case implements an arbitrary compression curve that can be varied in response to control by an external computer. In the present invention, the specific concern is how beamforming from a phased array may be accomplished. Prior art phased array systems have either employed A/D converters with very high resolution, or have required painstaking alignment of numerous critical analog circuits. In phased array systems, the desired level of quantization noise is not a function of the signal level being quantized, but is instead a function of the general level of all the signals at that particular time. Thus it is appropriate to provide a feedback quantum that is a function of time rather than a function of the signal level. For this purpose, the system shown in FIG. 2 may be used.

Figure 2:
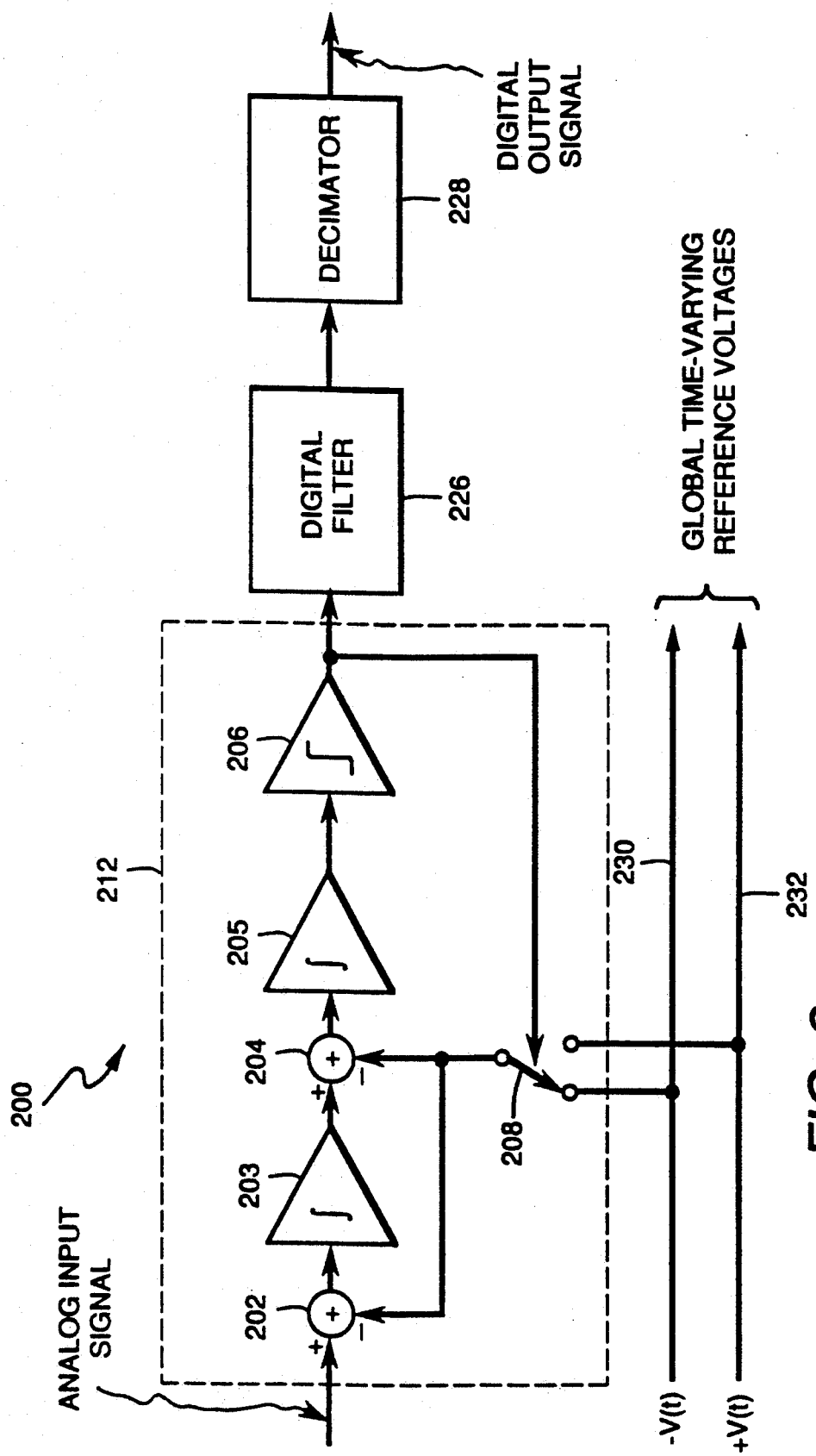
FIG. 2 is a block diagram of a second order delta sigma A/D converter modified according to the invention to include global time-varying reference voltages.

In FIG. 2, an A/D converter arrangement 200 for a single channel is shown employing an oversampled modulator 212 including first and second integrators 203 and 205, respectively, coupled in cascade with an intermediate differential summer 204. An analog input signal is furnished to integrator 203 through a differential summer 202. An A/D converter 206 in the form of a comparator or threshold circuit is coupled to the output of second integrator 205. A one-bit D/A converter in the form of a switch 208 is controlled by the output of A/D converter 206. Switch 208 supplies either a negative time-varying reference voltage −V(t) or a positive time-varying reference voltage +V(t) to differential summers 202 and 204, depending on whether the output signal from comparator 206 is a digital "one" or "zero". The output of modulator 212 is coupled to a digital filter 226, the output of which is, in turn, coupled to a decimator 228. Decimator 228 produces the digital output signal of A/D arrangement 200.

In modulator 212, A/D converter 206 and D/A converter 208 are of single bit resolution, and each may comprise, for example, a simple comparator and a pair of switches coupling the comparator output to each of the two reference voltages, respectively. Since two integrators 203 and 205 are employed, modulator 212 in this instance is a second order oversampled modulator.

In the embodiment of FIG. 2, globally determined time-vaying reference voltages −V(t) and +V(t) are distributed to the A/D converters in each channel over buses 230 and 232, respectively. These time-varying reference voltages are used to determine the size of the feedback quantum. As a result, both the instantaneous scale factor and the quantization noise level are adjusted as a function of time.

In an alternative embodiment shown in FIG. 3, wherein like reference numerals designate like or similar elements, A/D converter arrangement 200 for a single channel receives a digital code that is globally generated and distributed in like manner to the A/D converter arrangement in each of the channels. This code is supplied on a single bus 234 and specifies the magnitude of the feedback quantum. Moreover, the embodiment of FIG. 3 permits some corrections to be applied which may differ in different channels. Specifically, the code supplied on bus 234 is provided to a local gain and offset calculating unit 236 which modifies the code. The modified code is supplied to D/A converter 238 which generates the time-varying reference voltages −V(t) and +V(t). Thus if a particular channel has a voltage offset or an incorrect gain, the actual reference voltages used in that channel can be trimmed by digital computation in calculating unit 236 before being used to generate the feedback quanta. For example, if a particular channel has an undesired offset, the globally distributed codes can be appropriately incremented to cancel the offset. Similarly, if a particular channel has an undesired gain variation, the globally distributed codes can be multiplied by a local correction factor to bring the effective gain into line.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

Having thus described my invention, what I claim as new and desire to secure by Letters Patent is as follows:

1. A delta sigma analog-to-digital converter comprising:
   an oversampled interpolative modulator for receiving an input analog signal to be converted and for generating an output digital signal in response thereto;
   digital filter means responsive to the output digital signal of said oversampled interpolative modulator for generating a filtered digital output signal having a predetermined sampling rate;
   a decimator responsive to the filtered digital output signal of said digital filter for compressing the sampling rate of said filtered digital output signal; and
   means for supplying time-varying reference voltages to said oversampled interpolative modulator;
   said oversampled interpolative modulator comprising:
      differential summing means for receiving said input analog signal and subtractively adding a reference voltage to generate a difference output signal;
      at least one integrator coupled to said differential summing means for integrating said difference output signal;
      comparator means;
      circuit means coupling said comparator means to said at least one integrator so as to enable said comparator means to generate a digital "one" or "zero" depending on whether the integrated output signal exceeds a predetermined threshold; and
      switching means coupled to receive said time-varying reference voltages and responsive to said comparator means for switchably applying a selected one of said time-varying reference voltages to said differential summing means.

2. The delta sigma analog-to-digital converter recited in claim 1 wherein said means for supplying time-varying reference voltages to said oversampled interpolative modulator comprises first and second voltage buses.

3. The delta sigma analog-to-digital converter recited in claim 1 wherein said means for supplying time-varying reference voltages to said oversampled interpolative modulator comprises:
   a single data bus over which a reference code is transmitted; and
   digital-to-analog converter means responsitve to said reference code for generating first and second reference voltages.

4. The delta sigma analog-to-digital converter recited in claim 3 wherein said means for supplying time-varying reference voltages to said oversampled interpolative modulator further comprises calculating means interposed between said data bus and said digital-to-analog converter means for modifying said reference code.

5. The delta sigma analog-to-digital converter recited in claim 3 wherein said means for supplying time-varying reference voltages to said oversampled interpolative modulator further comprises calculating means interposed between said data bus and said digital-to-analog converter means for calculating a local gain correction.

6. The delta sigma analog-to-digital converter recited in claim 3 wherein said means for supplying time-varying reference voltages to said oversampled interpolative modulator further comprises calculating means interposed between said data bus and said digital-to-analog converter means for calculating a local offset correction.

7. The delta sigma analog-to-digital converter recited in claim 3 wherein said means for supplying time-varying reference voltages to said oversampled interpolative modulator further comprises calculating means interposed between said data bus and said digital-to-analog converter means for calculating a local gain correction and a local offset correction.

8. The delta sigma analog-to-digital converter of claim 1 wherein said circuit means comprises:

second differential summing means for receiving the integrated difference output signal; and a second integrator coupled to said second differential summing means for integrating output signals produced by said second differential summing means;

and wherein said switching means is further coupled to switchably apply said selected one of said timevarying reference voltages to said second differential summing means.

9. The delta sigma analog-to-digital converter recited in claim 8 wherein said means for supplying time-varying reference voltages to said oversampled interpolative modulator comprises first and second voltage buses.

10. The delta sigma analog-to-digital converter recited in claim 8 wherein said means for supplying time-varying reference voltages to said oversampled interpolative modulator comprises:

a single data bus over which a reference code is transmitted; and digital-to-analog converter means responsive to said reference code for generating first and second reference voltages.

11. The delta sigma analog-to-digital converter recited in claim 10 wherein said means for supplying time-varying reference voltages to said oversampled interpolative modulator further comprises calculating means interposed between said data bus and said digital-to-analog converter means for modifying said reference code.

* * * * *